(12) United States Patent
Lin et al.

(10) Patent No.: US 8,848,129 B2
(45) Date of Patent: Sep. 30, 2014

(54) BACK FRAME AND DISPLAY DEVICE HAVING THE SAME

(75) Inventors: Ting Wei Lin, New Taipei (TW); Ying Sui Cheng, Kaohsiung (TW); Yung Li Huang, Taoyuan County (TW); Chun Pin Liu, Taipei (TW)

(73) Assignee: Hannstar Display Corporation, New Taipei (TW)

( * ) Notice: Subject to any disclaimer, the term of this patent is extended or adjusted under 35 U.S.C. 154(b) by 61 days.

(21) Appl. No.: 13/204,040

(22) Filed: Aug. 5, 2011

(65) Prior Publication Data

US 2012/0113350 A1 May 10, 2012

(30) Foreign Application Priority Data

Nov. 9, 2010 (TW) ............................... 99138435 A

(51) Int. Cl.
*G02F 1/1333* (2006.01)
*H05K 7/14* (2006.01)

(52) U.S. Cl.
CPC .... *H05K 7/142* (2013.01); *G02F 2001/133314* (2013.01)
USPC ........................................... 349/58; 361/752

(58) Field of Classification Search
None
See application file for complete search history.

(56) References Cited

U.S. PATENT DOCUMENTS

| 6,512,514 | B1 * | 1/2003 | Warashina et al. ........... 345/206 |
| 7,333,164 | B2 * | 2/2008 | Lai et al. ........................ 349/58 |
| 2006/0158580 | A1 | 7/2006 | Lai et al. |

FOREIGN PATENT DOCUMENTS

| KR | 10-2006-0012859 A | 2/2006 |
| TW | M242728 | 9/2004 |

OTHER PUBLICATIONS

Office Action issued on Sep. 30, 2013 for the Taiwanese counterpart application 099138435 which cites TW M242728 and KR 10-2006-0012859A.
English translation of Office Action issued on Sep. 30, 2013 for the Taiwanese counterpart application 099138435.
English abstract of TW M242728 and KR 10-2006-0012859A.
Office Action issued on May 16, 2014 by SIPO for the counterpart CN Patent Application No. 201010571234.3 cites US 2006158580 and US 6512514.
English Abstract of Office Action issued on May 16, 2014 by SIPO for the counterpart CN Patent Application No. 201010571234.3.

* cited by examiner

*Primary Examiner* — Richard Kim
(74) *Attorney, Agent, or Firm* — WPAT. P.C.; Anthony King; Kay Yang

(57) ABSTRACT

The present invention is related to a back frame of a display device. The back frame includes a frame piece and a fixing member having a first portion, a second portion, and a third portion. The first portion extends toward the inside of the back frame. The second portion extends from the first portion and connects with the third portion, fixing a printed circuit board to prevent other internal connecting interfaces from loosening due to the printed circuit board shifting.

13 Claims, 12 Drawing Sheets

BACK FRAME AND DISPLAY DEVICE HAVING THE SAME

TECHNICAL FIELD

The present invention relates to a back frame and a display device. More particularly, the present invention relates to a back frame and a display device, all of which comprise a fixing member for fixing a printed circuit board.

BACKGROUND

Since electrical devices including netbooks and notebook (also called laptop) are required to be thinner and smaller in the trend of miniaturization, the display panels of such electrical devices also have to be designed for meeting miniaturization requirements. For achieving miniaturization of the display panel, the backlight module has to simplify its mechanical construction. For instance, in the bend type of backlight module, most rear is surfaces of the back frame have been hollowed out to reduce the weight of the back frame. However, due to mechanical simplification, the weak construction has difficulty in securing the printed circuit board (PCB) and causes the printed circuit board to vibrate extensively. Due to such vibration, the connection interfaces of the flexible printed circuit (FPC) connectors are easily disengaged or disconnected, which reduces reliability of these electrical devices. Therefore, researchers still focus on the issue of avoiding disengagement of connecting interfaces due to the difficulty in securing PCBs while still maintaining miniaturization.

A conventional back frame is shown in FIG. 1. In FIG. 1, the back frame 11 of the display 10 includes an accommodating groove 13 for disposition of the printed circuit board 12. This design usually preserves certain gap tolerances, alignment tolerances, and manufacturing tolerances, which cause the printed circuit board 12 to vibrate in the X-Y plane due to the movement of the display device 10. Although the back frame 11 has stoppers 111 around the accommodating groove 13, the stoppers 111 only stop the movement of the printed circuit board 12 in the Z axis, as shown in FIG. 2 as an enlarged view of FIG. 1. In addition, since the stoppers 111 utilize their surface area to stop the PCB 12, the efficient stopping areas are limited in accordance with surface areas of the stoppers 111. Although the PCB 12 can be stopped by the stoppers 111 in the Z axis, the vibration of the PCB 12 in the X-Y plane cannot be stopped by the stoppers 111 due to those tolerances, thereby causing the PCB 12 to disengage with the connecting interface and away from the efficient stopping areas.

In summary, the tolerances in the conventional accommodation groove 13 of the back frame 11 might cause connecting disengagement. The conventional stoppers 111 cannot efficiently avoid the disengagement. Therefore, there is still a need for a back frame having a fixing member in display device.

SUMMARY

The present invention provides a new and improved back frame, which includes a fixing member for fixing a printed circuit board to prevent other internal connecting interfaces from loosening due to vibration of the printed circuit board.

To achieve the above-mentioned design, the present invention provides a back frame for fixing or securing a printed circuit board. The back frame includes a frame, which includes a frame piece, and a fixing member. The fixing member includes a first portion, a second portion, and a third portion. The first portion extends from the frame piece toward an inside area surrounded by the frame. The second portion extends from the first portion. The third portion connects with the second portion.

The present invention also provides a circuit frame module, which includes a back frame and a printed circuit board. The printed circuit board is disposed in the inside area of the back frame and includes a securing aperture. The back frame includes a frame, including a frame piece, and the fixing member, which includes a first portion, extending from the frame piece toward an inside area surrounded by the frame, a second portion, extending from the first portion, and a third portion, connecting with the second portion. The securing aperture fits with the third portion for fixing or securing the printed circuit board in the back frame.

The present invention discloses a display device, which comprises a backlight module, a liquid crystal display module, and a circuit frame module. The backlight module includes a light emitting surface. The liquid crystal display device is disposed on the light emitting surface. The circuit frame module includes a back frame and a printed circuit board, electrically coupled to the liquid crystal display module for transmitting signals to the liquid crystal display module. To prevent the displacement of the printed circuit board and disengagement between the connecting interfaces, the back frame further includes a fixing member. The fixing member includes a first portion, a second portion, and a third portion. The first portion extends from the frame piece toward an inside area surrounded by the frame. The second portion extends from the first portion. The third portion connects with the second portion. In addition, the securing aperture fits with the third portion for fixing or securing the printed circuit board in the back frame.

The foregoing has outlined rather broadly the features and technical advantages of the present invention in order that the detailed description of the invention that follows may be better understood. Additional features and advantages of the invention will be described hereinafter, and form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The accompanying drawings, which are incorporated in and constitute a part of this specification, illustrate embodiments of the disclosure and, together with the description, serve to explain the principles of the invention.

DETAILED DESCRIPTION

Figure 1:
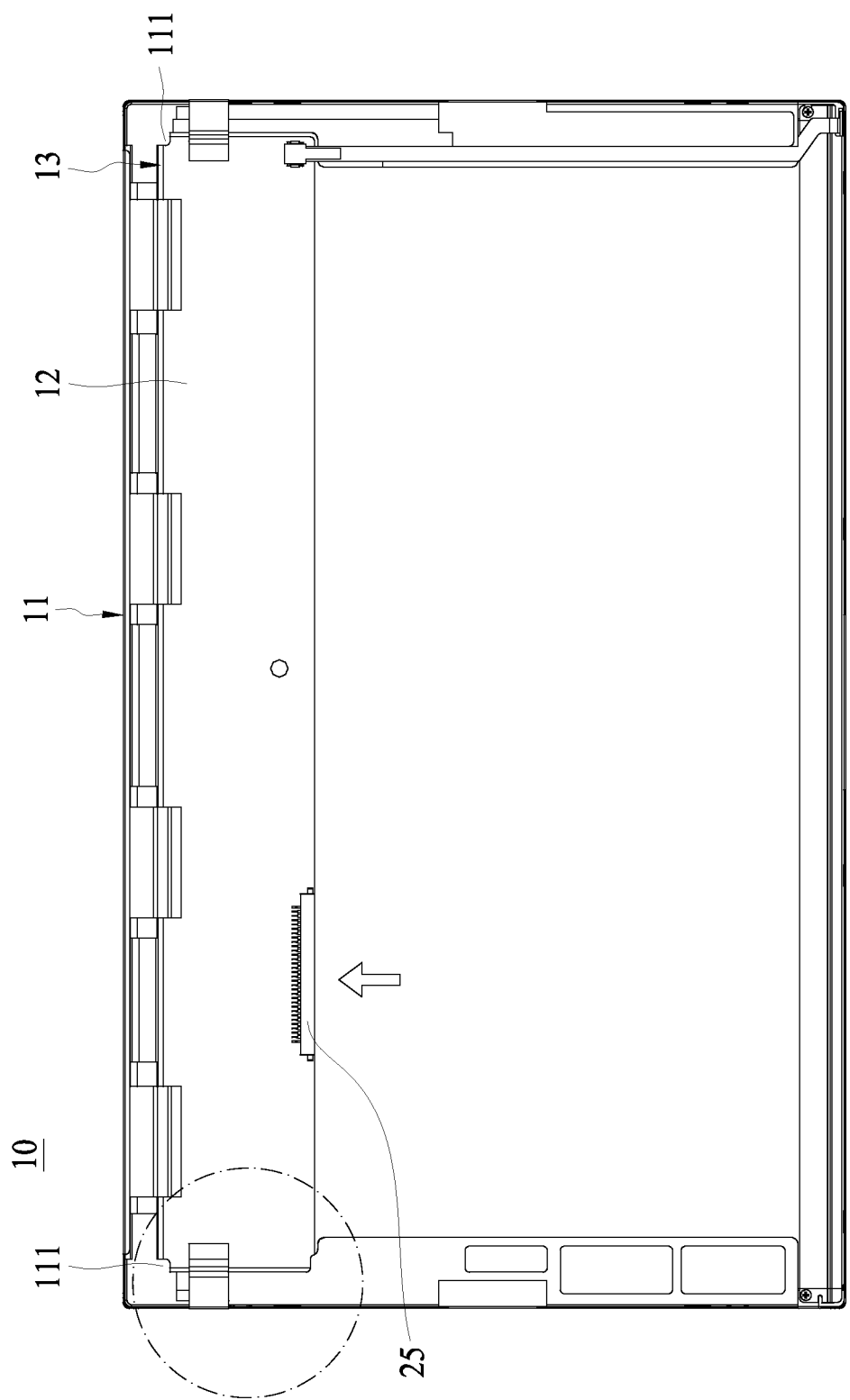
FIG. 1 shows a perspective view of a conventional circuit frame module.
Figure 2:
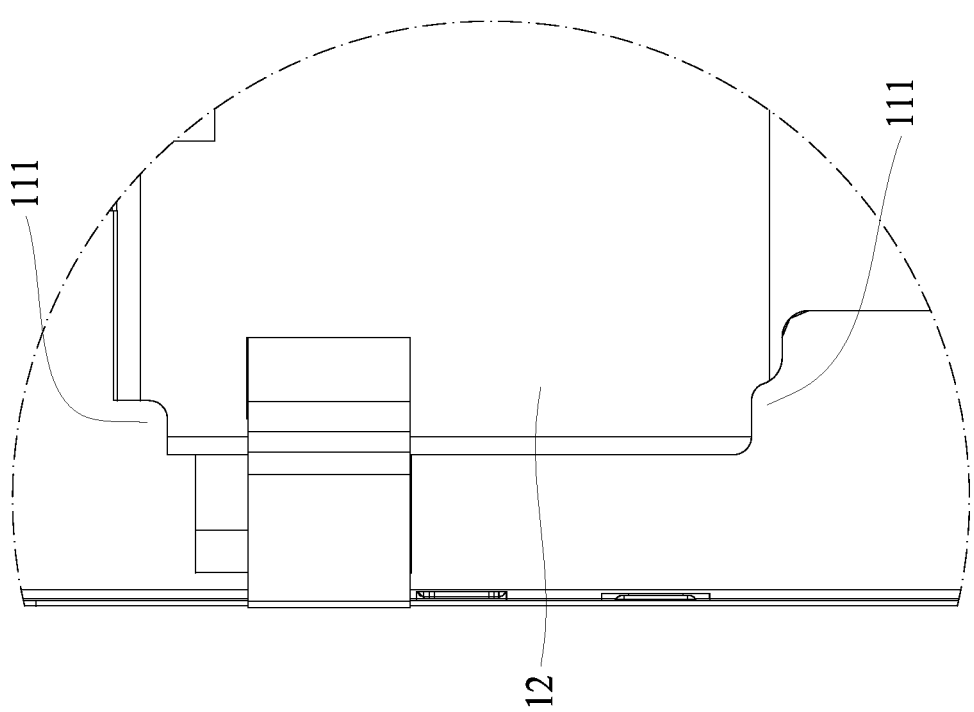
FIG. 2 shows an enlarged view of the circular area of FIG. 1 in the conventional circuit frame module.
Figure 3:
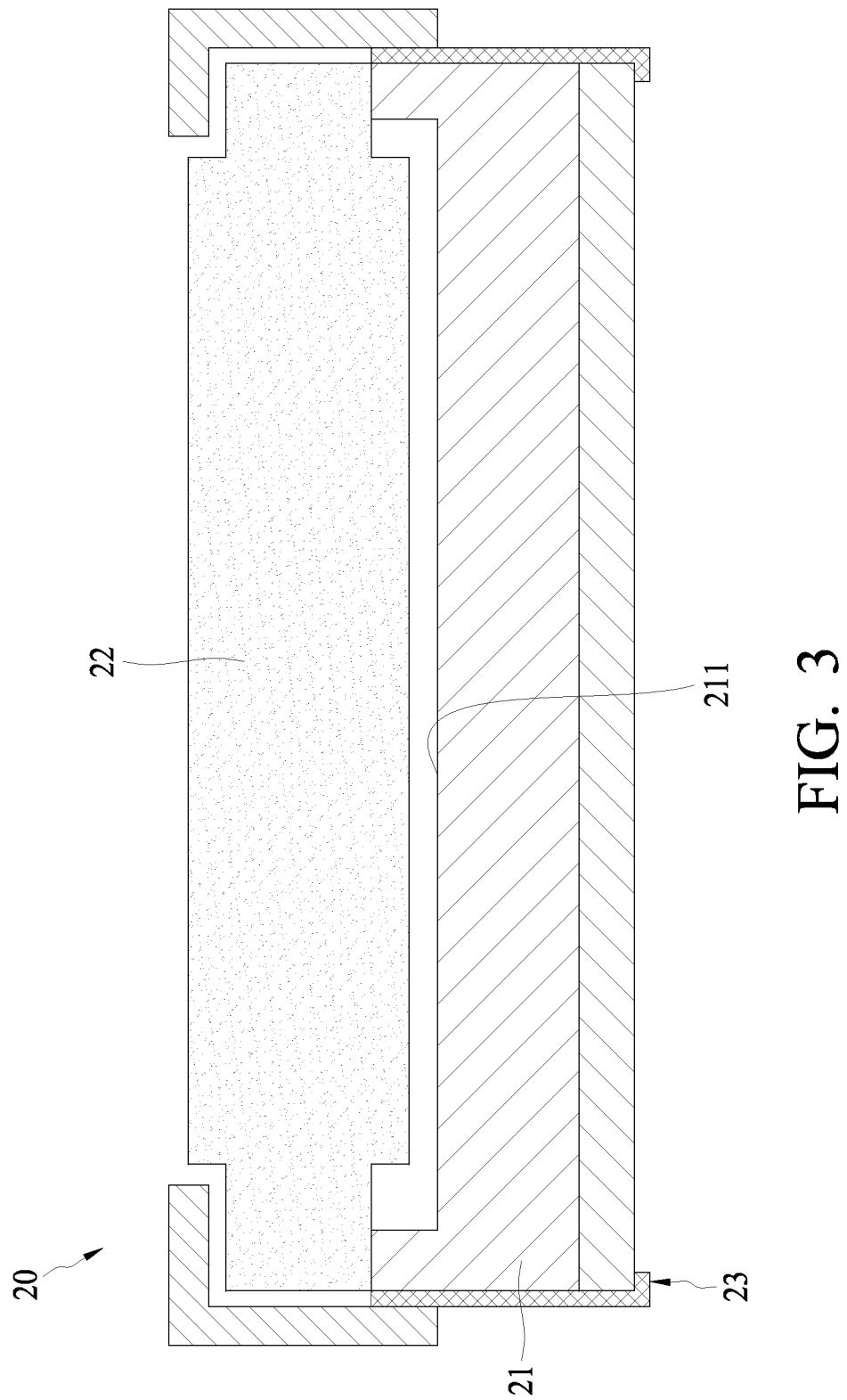
FIG. 3 shows a cross-sectional view of a display device in accordance with an embodiment of the present invention.
Figure 4:
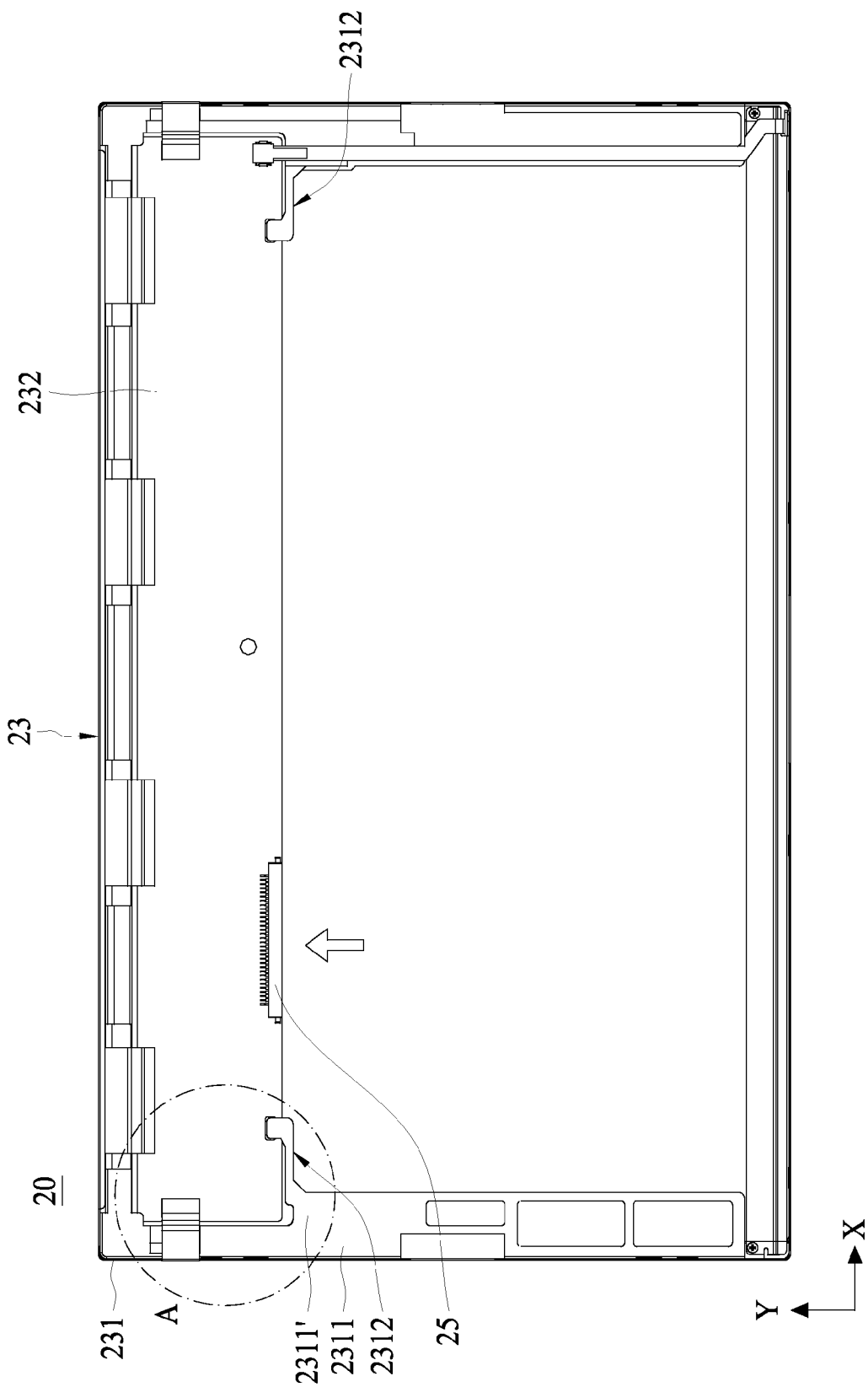
FIG. 4 shows a perspective view of a circuit frame module in accordance with an embodiment of the present invention.

Some preferred embodiments of the present invention will be described with reference to the accompanying drawings, in which like reference numerals designate same or corresponding portions. Referring to FIG. 3, the display device 20 of the present invention comprises a backlight module 21, a liquid crystal display module 22 and a circuit frame module 23. The backlight module 21 includes a light emitting surface 211, on which the liquid crystal display module 22 is disposed for displaying images. As shown in FIG. 4, the circuit frame module 23 of the display device 20 includes a back frame 231 and a printed circuit board (PCB) 232. The back frame 231 includes a fixing member 2312 and a frame 2311, which includes a frame piece 2311'. In the embodiment, the printed circuit board 232 is accommodated in the back frame 231 and electrically coupled to the liquid crystal display module 22 for transmitting signals to the liquid crystal display module 22.

Figure 5:
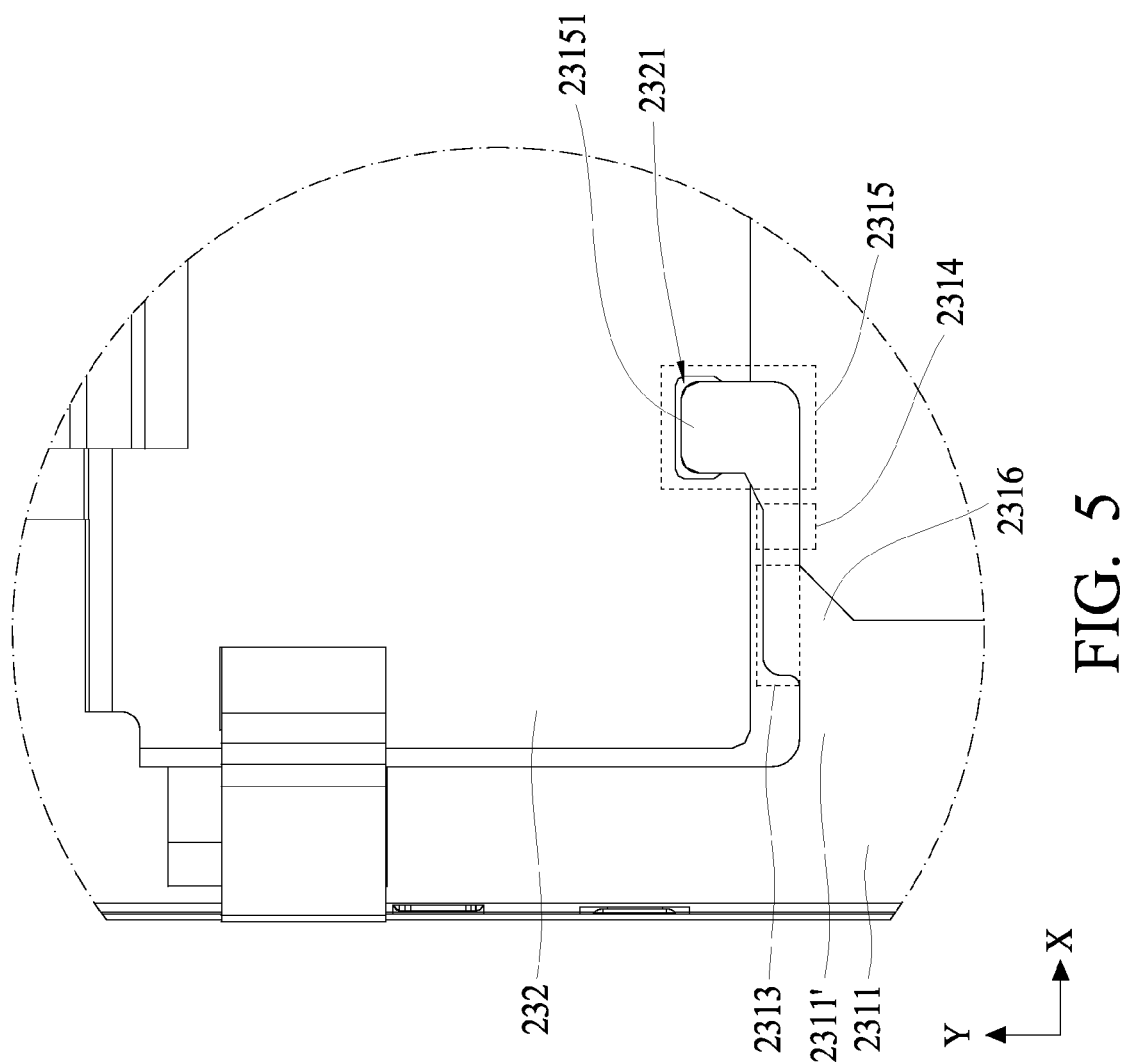
FIG. 5 shows an enlarged view of a circular area of FIG. 4 illustrating a is fixing member of the circuit frame module in accordance with an embodiment of the present invention.

Referring to FIG. 5, which is an enlarged view of left circle A of FIG. 4. It is obvious that the fixing member 2312 includes a first portion 2313, a second portion 2314, and a third portion 2315. The first portion 2313 extends from the frame piece 2311' toward an inside area surrounded by the frame 2311. In the embodiment, the first portion 2313 extends along a direction X perpendicular to the axial direction Y of the frame piece 2311'. In other words, the extending direction X of the first portion 2313 is perpendicular to the axial direction Y of the frame piece 2311'. However, in another embodiment (not shown), an included angle between the extending direction X of the first portion 2313 and the axial direction Y of the frame piece 2311' is not limited to a right angle and can be other appropriate angles according to different designs for securing the printed circuit board 232. In the embodiment, the second portion 2314 connects with the first portion 2313 and extends from the first portion 2313 along the direction X. However, the second portion 2314 cannot be too long to have enough strength for securing the printed circuit board 232. Thus, the length of the second portion 2314 is preferably less than the length of the first portion 2313 for providing stable strength to secure the printed circuit board 232. In the embodiment shown in FIG. 6, the length of the second portion 2314 can be designed to be greater than the length of the first portion 2313. Referring to the embodiment shown in FIG. 6, the fixing member 2312 of the display device 20 further includes a supporting part 2316. The supporting part 2316 includes a first edge 23161 and a second edge 23162. The first edge 23161 connects with the frame 2311, while the second edge 23162 connects a connecting area where the first portion 2313 connects with the second portion 2314. However, in another embodiment shown in FIG. 5, the supporting part 2316 can integrate with the first portion 2313. Therefore, the supporting part 2316 can provide additional securing force to allow the fixing member 2312 to secure the printed circuit board 232. Consequently, the fixing member 2312 prevents the printed circuit board 232 accommodated in the back frame 231 from vibrating in the X-Y plane and from the disengagement of the connecting interface 25.

Figure 6:
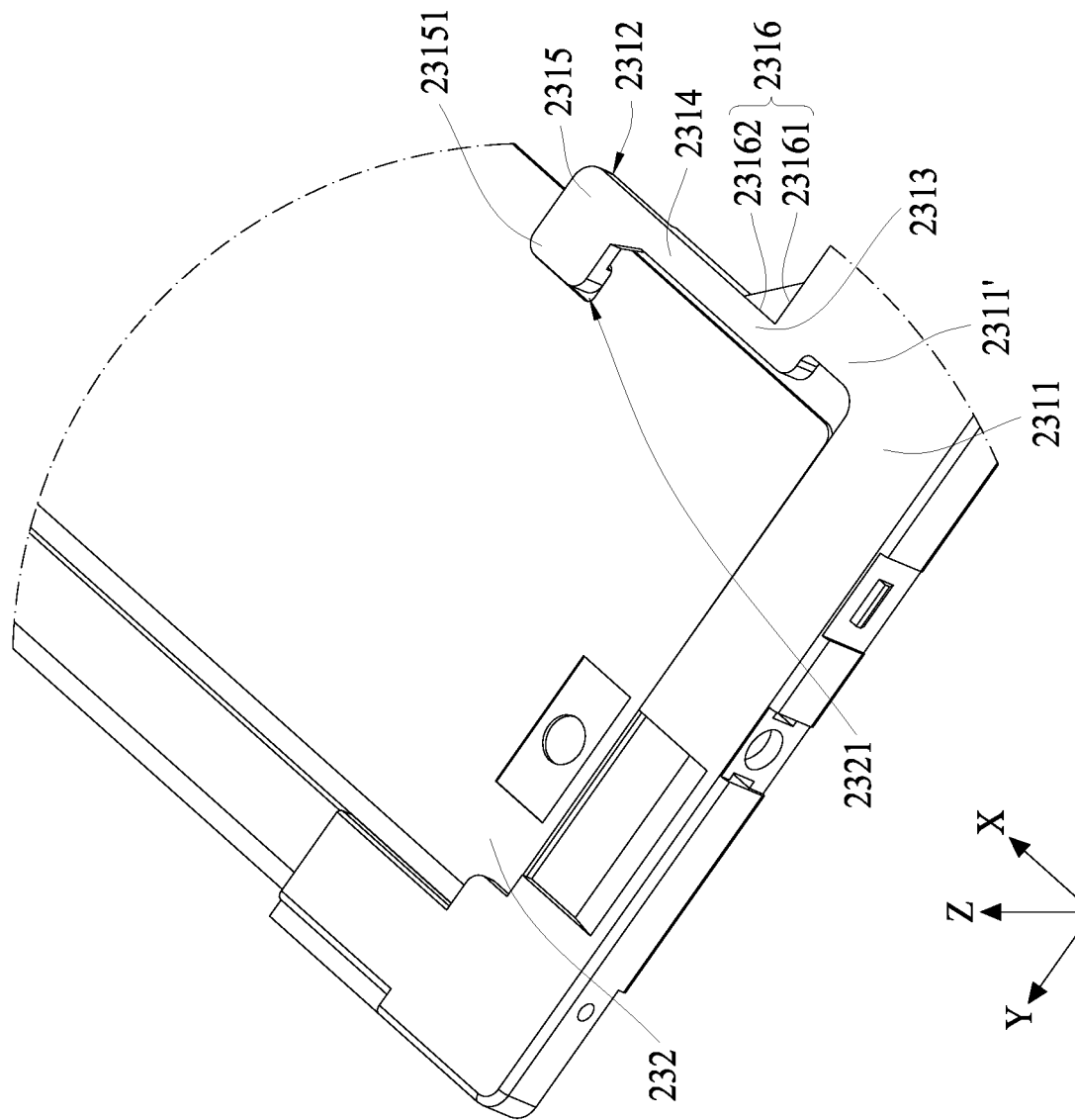
FIG. 6 shows a lateral view of FIG. 5 illustrating the fixing member according to one embodiment of the present invention.
Figure 7:
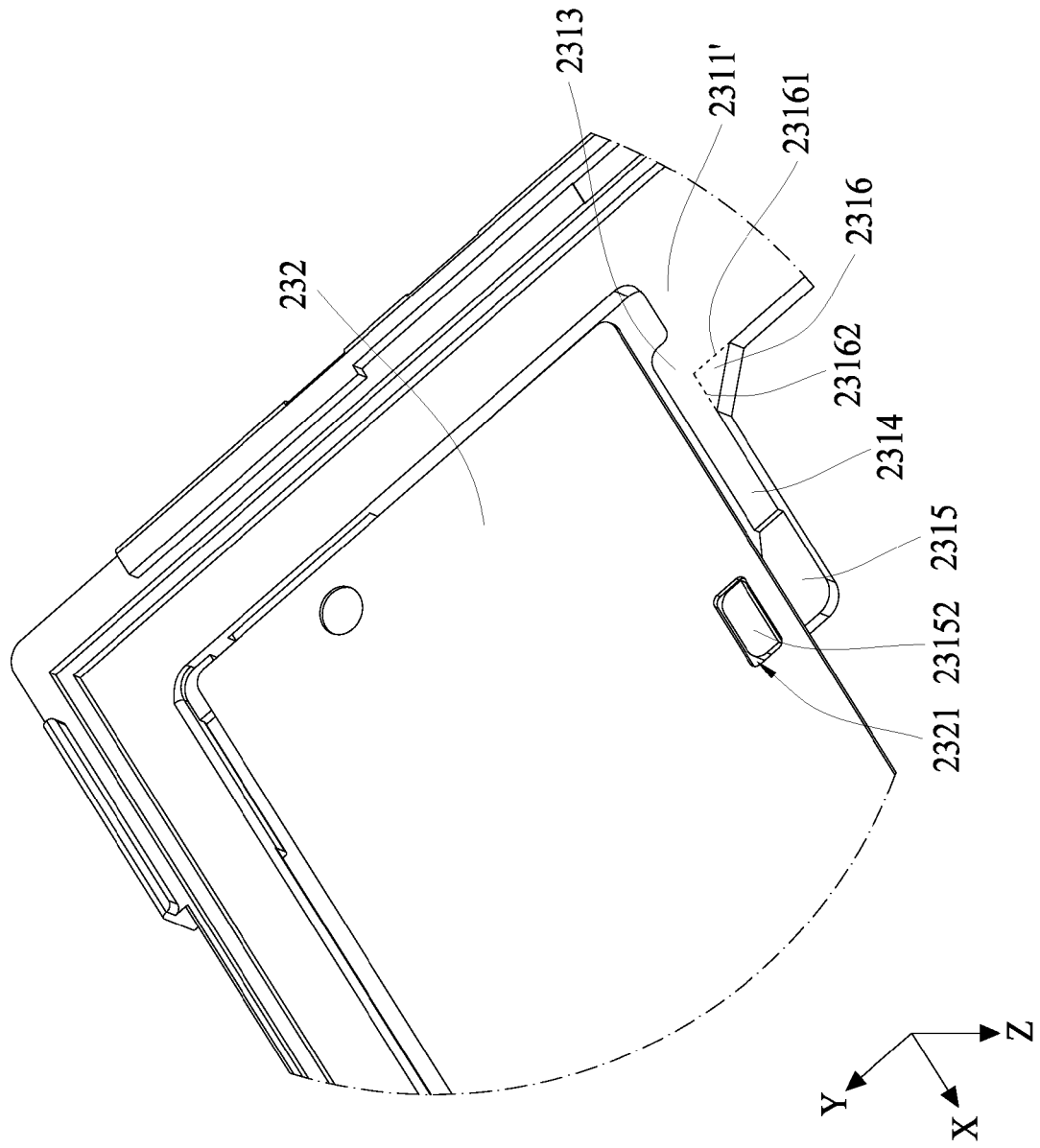
FIG. 7 shows a rear view of FIG. 6 illustrating the fixing member according to one embodiment of the present invention.

As shown in FIG. 5, the third portion 2315 connects with the second portion 2314 and extends from the second portion 2314 along the direction Y. FIG. 6 is a lateral view of the left circle A of FIG. 4. FIG. 6 shows a rear view of the circle A in the display device 20. FIG. 7 shows a front view of the circle A in the display device 20 and other components such as the backlight module have been removed. As shown in FIG. 6 and FIG. 7, the third portion 2315 extends along the direction Y to a terminal 23151, wherein there is a bump 23152 formed on the bottom of the terminal 23151. The bump 23152 fits with the securing aperture 2321 for securing the printed circuit board 232 in the X-Y plane and to prevent disengagement.

Figure 8:
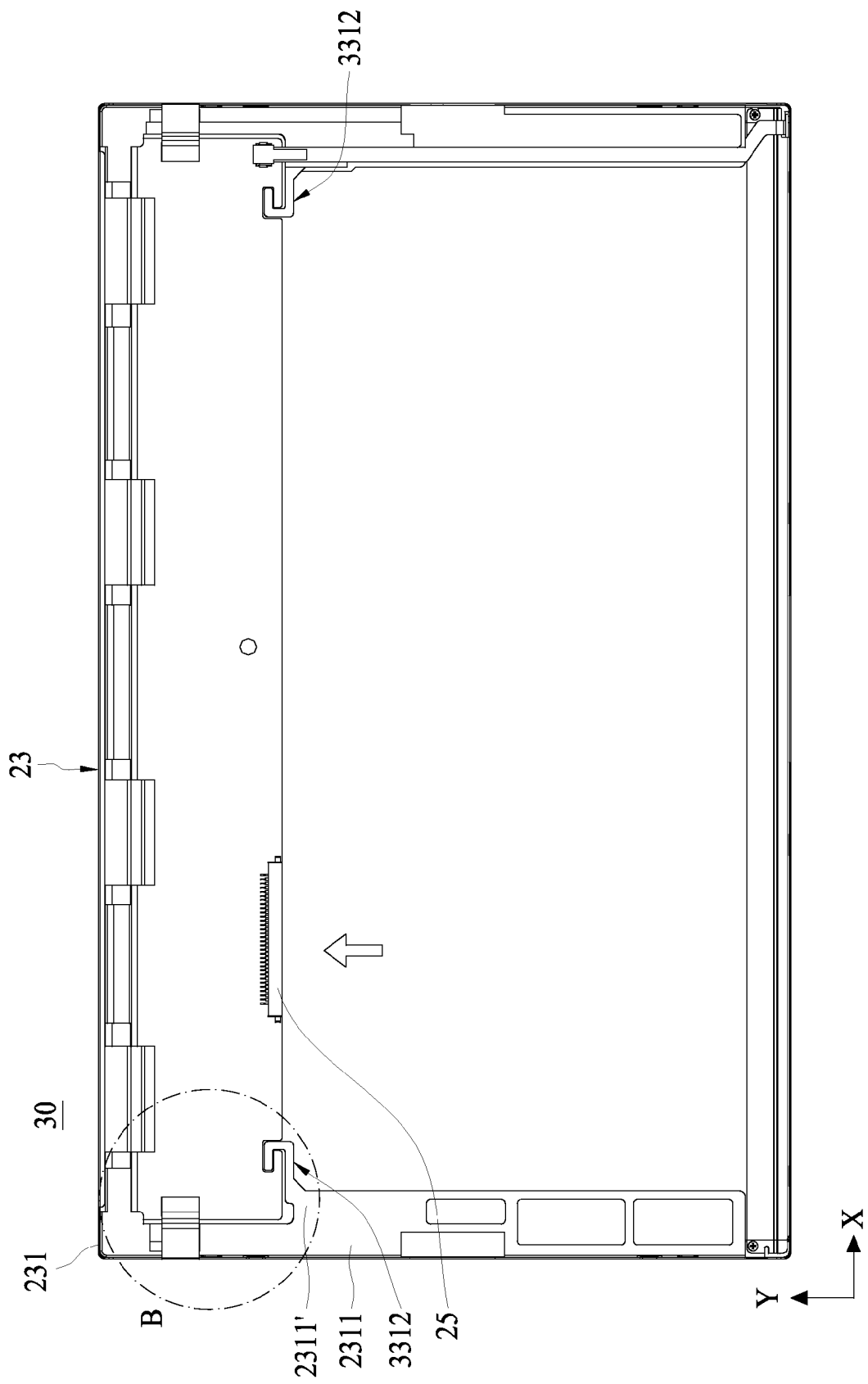
FIG. 8 shows a perspective view of a circuit frame module in accordance with another embodiment of the present invention.
Figure 9:
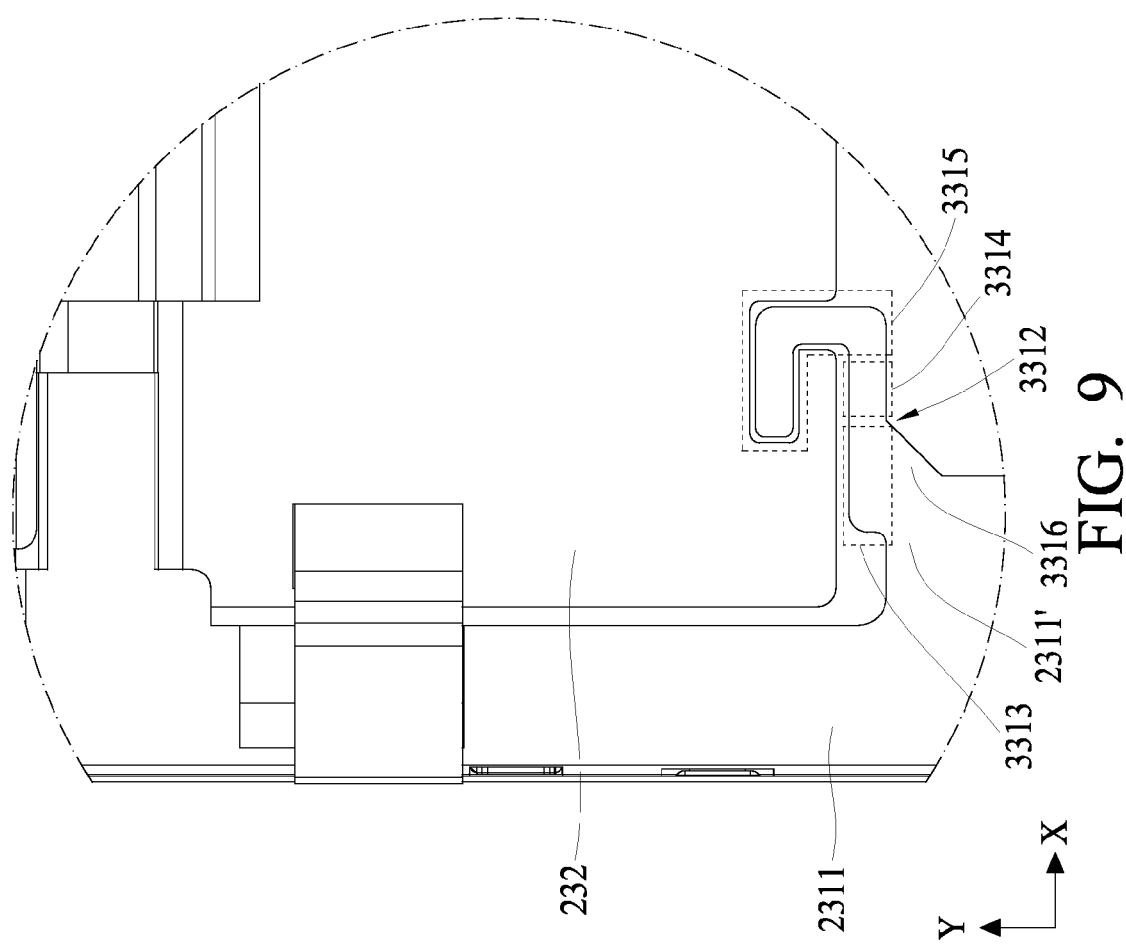
FIG. 9 shows an enlarged view of a circular area of FIG. 8 illustrating a fixing member of the circuit frame module in accordance with another embodiment of the present invention.
Figure 10:
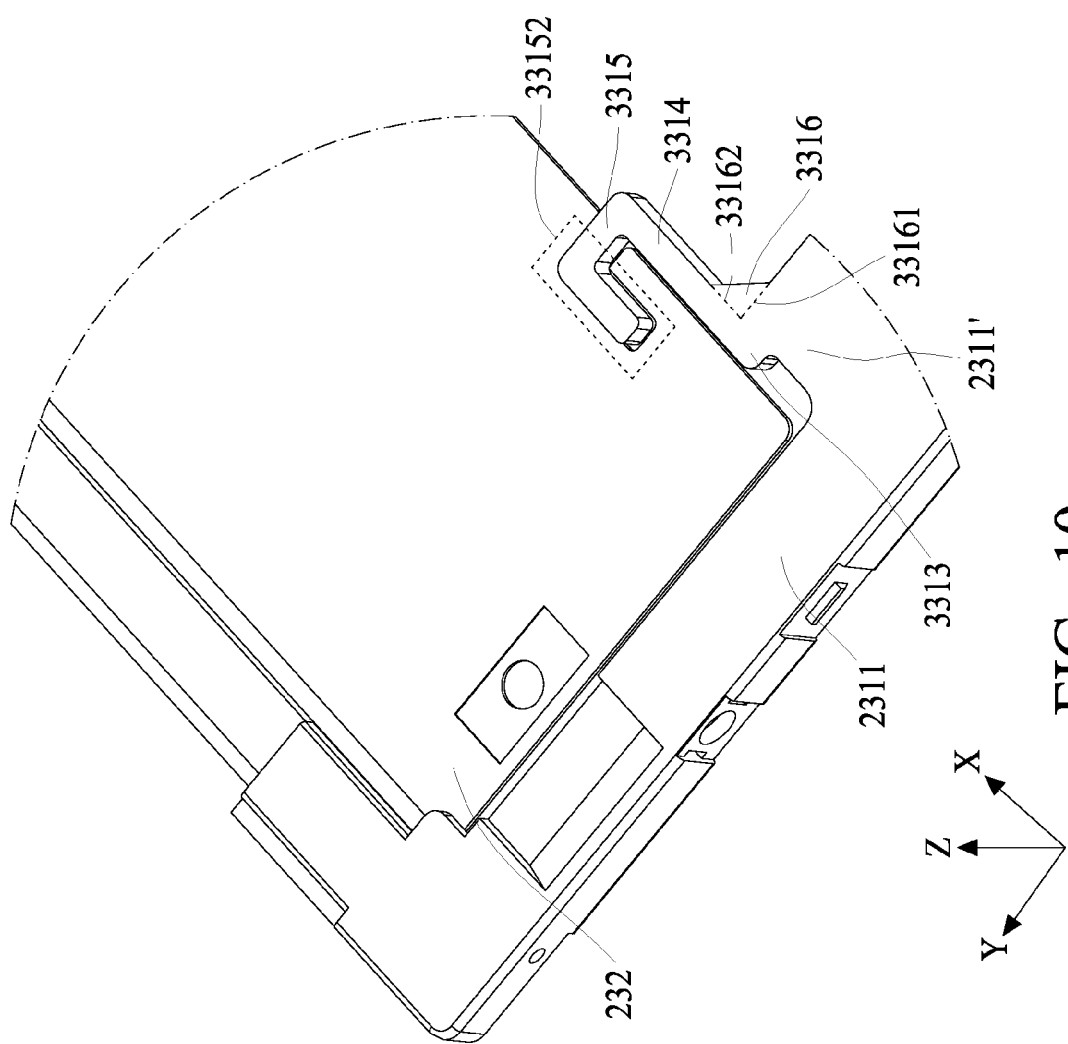
FIG. 10 shows a lateral view of FIG. 9 illustrating the fixing member according to another embodiment of the present invention.
Figure 11:
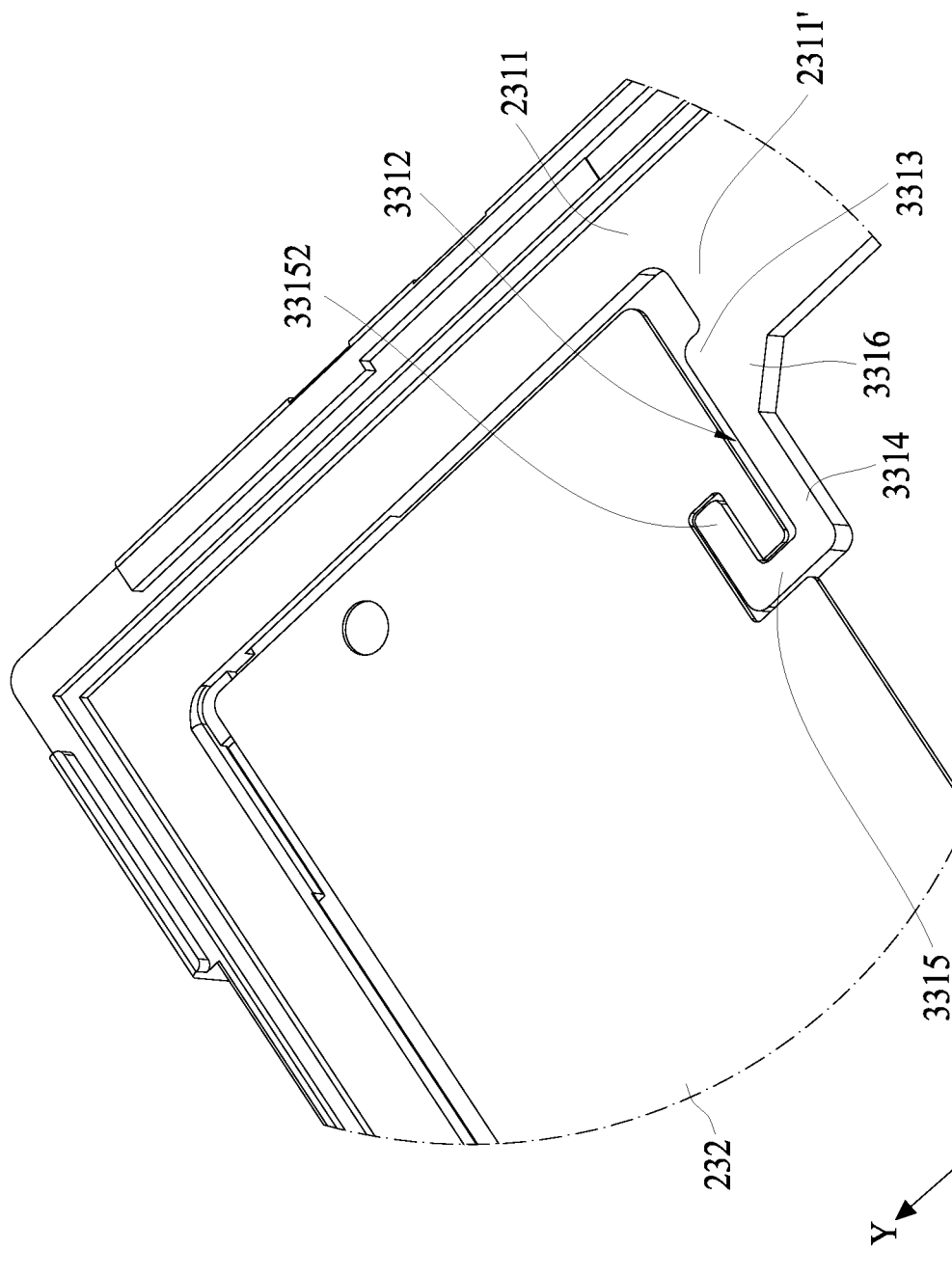
FIG. 11 shows a rear view of FIG. 10 illustrating the fixing member according to another embodiment of the present invention.
Figure 12:
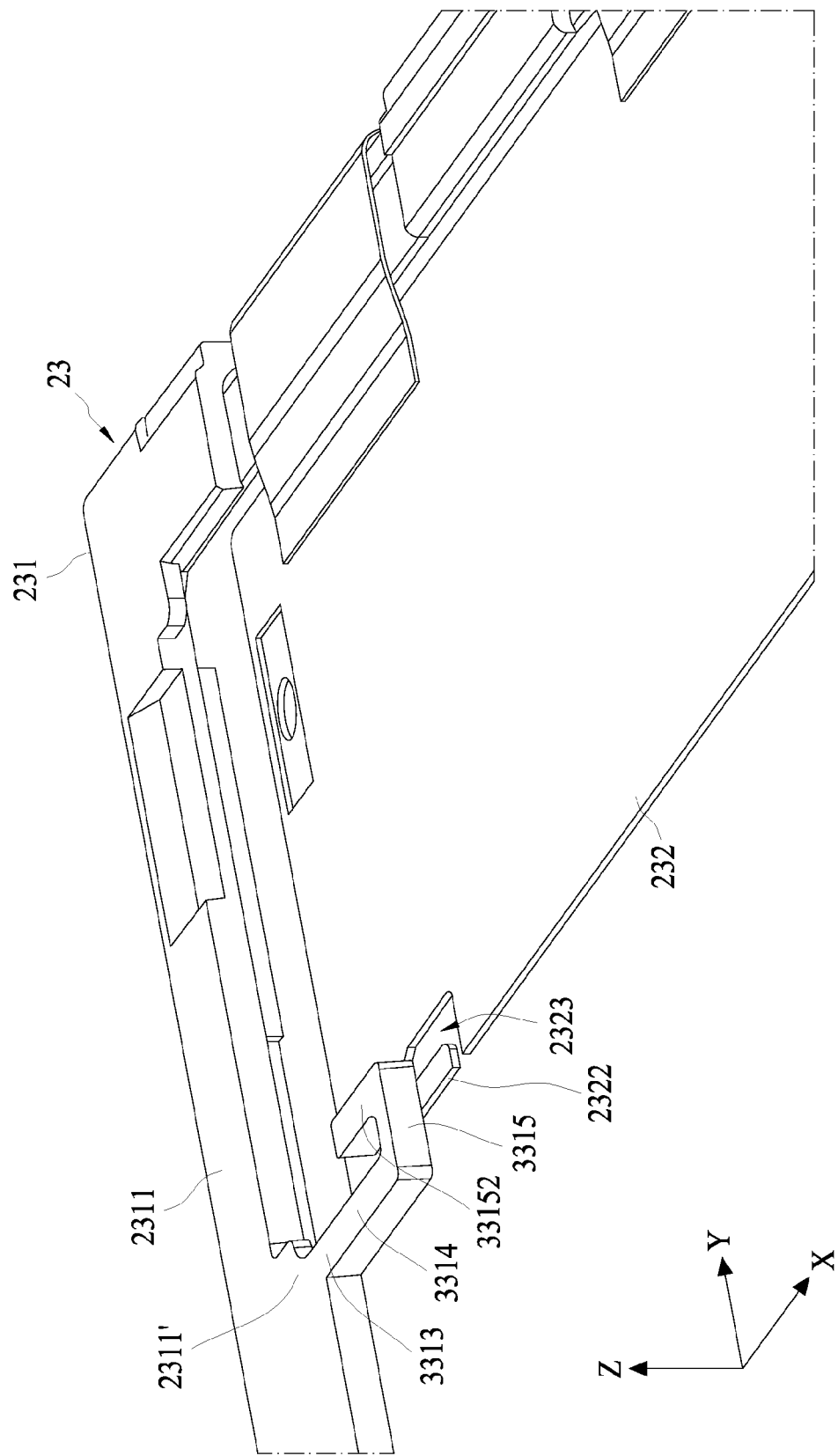
FIG. 12 shows a lateral view illustrating the fixing member according to another embodiment of the present invention.

In another embodiment shown in FIG. 8, the components of the display device 30 are similar to those components of the above-mentioned embodiments. The main difference is the configuration of the fixing member 3312. Referring to FIG. 9, which is an enlarged view of the left circle B of FIG. 8, the fixing member 3312 includes a first portion 3313, a second portion 3314, and a third portion 3315. The first portion 3313 extends from the frame piece 2311' toward an inside area surrounded by the frame 2311. In the embodiment, the first portion 3313 extends along a direction X perpendicular to the axial direction Y of the frame piece 2311'. However, in another embodiment (not shown), an included angle between the extending direction X of the first portion 3313 and the axial direction Y of the frame piece 2311' is not limited to a right angle and can be other appropriate angles according to different designs for securing the printed is circuit board 232. In the embodiment, the second portion 3314 connects with the first portion 3313 and extends from the first portion 3313 along the direction X. However, the second portion 3314 cannot be too long to have enough strength for securing the printed circuit board 232. Thus, the length of the second portion 3314 is preferably less than the length of the first portion 3313 for providing stable strength to secure the printed circuit board 232. In the embodiment shown in FIG. 10, the length of the second portion 3314 can be designed to be greater than the length of the first portion 3313. FIG. 11 is a lateral view of the left circle B of FIG. 8. FIG. 11 shows a rear view of the circle B in the display device 30. FIG. 12 shows a front view of the circle B in the display device 30 and other components such as the backlight module have been removed. Referring to FIG. 10 and FIG. 11, the fixing member 3312 of the display device 30 further includes a supporting part 3316. The supporting part 3316 includes a first edge 33161 and a second edge 33162. The first edge 33161 connects with the frame 2311, while the second edge 33162 connects a connecting area where the first portion 3313 connects with the second portion 3314. However, in another embodiment shown in FIG. 9, the supporting part 3316 can integrate with the first portion 3313. Therefore, the supporting part 3316 can provide additional securing force to allow the fixing member 3312 to secure the printed circuit board 232. As shown in FIG. 11 and FIG. 12, the third portion 3315 connects with the second portion 3314 and extends from the second portion 3314 along the direction Y. In the embodiment, the third portion 3315 further includes a bent section 33152, which is parallel to the second portion 3314. In other words, the bent section 33152 is bent along a direction perpendicular to the direction Y. Preferably, the bent section 33152 is bent and faces to the frame 2311. However, in another embodiment (not shown), the bent section 33152 can be designed to be away from the frame piece 2311' in the direction X. In the embodiment shown in FIG. 11, the securing aperture is formed as a bent groove 2323 along an edge 2322 of the printed circuit board 232. The bent groove 2323 fits with the bent section 33152 of the third portion 3315 for securing the is printed circuit board 232 in the X-Y plane and for preventing vibration of the printed circuit board 232.

In the embodiment shown in FIG. 12, the fixing member 3312 without any supporting part 3316 still has enough strength for securing the printed circuit board 232 in the X-Y plane and for preventing vibration of the printed circuit board 232 in the X-Y plane, thereby preventing disengagement of the connecting interfaces 25.

Although the present invention and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A back frame for fixing a printed circuit board, the back frame comprising:
   a frame, including a frame piece;
   a fixing member, including:
      a first portion, extending from the frame piece toward an inside area surrounded by the frame;
      a second portion, extending from the first portion; and
      a third portion, connecting with the second portion and fixing the printed circuit board having a securing aperture, wherein the third portion extends to a terminal, and the terminal includes a bump formed on the bottom of the terminal, wherein a first surface of the fixing member is coplanar with a first surface of the frame piece, and the securing aperture is formed as a bent groove along an edge of the printed circuit board, and the bent groove fits with the third portion.

2. The back frame of claim 1, wherein the fixing member further includes a supporting part, the supporting part includes a first edge and a second edge, the first edge connects with the frame, and the second edge connects a connecting area where the first portion connects with the second portion.

3. The back frame of claim 1, wherein the first portion extends along a direction perpendicular to an axial direction of the frame piece, and the length of the second portion is less than the length of the first portion.

4. The back frame of claim 3, wherein the third portion extends from the second portion along the axial direction of the frame piece.

5. The back frame of claim 1, wherein a bent section is bent and facing to the frame piece.

6. A display device, comprising:
   a backlight module, including a light emitting surface;
   a liquid crystal display module, disposed on the light emitting surface; and
   a circuit frame module, including:
      a back frame, including:
         a frame, including a frame piece;
         a fixing member, including:
            a first portion, extending from the frame piece toward an inside area surrounded by the frame;
            a second portion, extending from the first portion; and
            a third portion, connecting with the second portion; and
      a printed circuit board, disposed in the inside area and including a securing aperture, wherein the securing aperture fits with the third portion, and the printed circuit board is electrically coupled to the liquid crystal display module, wherein the third portion includes a bent section, and the bent section is parallel to the second portion, and the securing aperture is formed as a bent groove along an edge of the printed circuit board, and the bent groove fits with the third portion.

7. The display device of claim 6, wherein the fixing member further includes a supporting part, the supporting part includes a first edge and a second edge, the first edge connects with the frame, and the second edge connects a connecting area where the first portion connects with the second portion.

8. The display device of claim 6, wherein the first portion extends along a direction perpendicular to an axial direction of the frame piece, and the length of the second portion is less than the length of the first portion.

9. The display device of claim 8, wherein the third portion extends from the second portion along the axial direction of the frame piece.

10. The display device of claim 9, wherein the third portion extends to a terminal, and the terminal includes a bump formed on the bottom of the terminal.

11. The display device of claim 10, wherein the securing aperture fits with the bump.

12. The display device of claim 6, wherein the bent section is bent and facing to the frame piece.

13. A back frame for fixing a printed circuit board, the back frame comprising:
   a frame, including a frame piece;
   a fixing member, including:
      a first portion, extending from the frame piece toward an inside area surrounded by the frame;
      a second portion, extending from the first portion; and
      a third portion, connecting with the second portion and fixing the printed circuit board having a securing aperture, wherein the third portion includes a bent section, and the bent section is parallel to the second portion, and the securing aperture is formed as a bent groove along an edge of the printed circuit board, and the bent groove fits with the third portion.

* * * * *